US008902356B2

(12) United States Patent
Seo et al.

(10) Patent No.: US 8,902,356 B2
(45) Date of Patent: Dec. 2, 2014

(54) IMAGE SENSOR MODULE HAVING IMAGE SENSOR PACKAGE

(75) Inventors: Byoung-Rim Seo, Hwaseong-si (KR);
Beoung-Ouk Min, Yongin-si (KR);
Tae-Je Cho, Yongin-si (KR);
Yung-Cheol Kong, Cheonan-si (KR);
Dong-Min Kim, Suwon-si (KR);
Ji-Woong Park, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 442 days.

(21) Appl. No.: 13/049,767

(22) Filed: Mar. 16, 2011

(65) Prior Publication Data

US 2011/0267535 A1    Nov. 3, 2011

(30) Foreign Application Priority Data

Apr. 29, 2010  (KR) .................. 10-2010-0039836

(51) Int. Cl.
*H04N 5/225* (2006.01)
*H01L 27/146* (2006.01)

(52) U.S. Cl.
CPC .............................. *H01L 27/14618* (2013.01)
USPC ........................................................ 348/374

(58) Field of Classification Search
CPC . H04N 5/2251; H04N 5/2252; H04N 5/2253; H04N 5/2254; H04N 5/335; H04N 5/378
USPC ............................ 348/374, 373, 294, 302, 311
See application file for complete search history.

(56) References Cited

U.S. PATENT DOCUMENTS

| | | | | |
|---|---|---|---|---|
| 6,144,507 A * | 11/2000 | Hashimoto | .................... | 359/819 |
| 6,384,397 B1 * | 5/2002 | Takiar et al. | ............... | 250/208.1 |
| 6,654,064 B2 * | 11/2003 | Ishikawa | ...................... | 348/374 |
| 6,762,796 B1 * | 7/2004 | Nakajoh et al. | ............... | 348/340 |
| 7,166,907 B2 | 1/2007 | Onishi et al. | | |
| 7,294,827 B2 * | 11/2007 | Tan et al. | ...................... | 250/239 |
| 7,630,016 B2 * | 12/2009 | Nagano | ....................... | 348/374 |
| 7,812,433 B2 * | 10/2010 | Cheng et al. | ................... | 257/680 |
| 2003/0218251 A1 * | 11/2003 | Seo | ................ | 257/737 |
| 2004/0041938 A1 * | 3/2004 | Seo et al. | ...................... | 348/340 |
| 2004/0094825 A1 * | 5/2004 | Onishi et al. | .................. | 257/666 |
| 2004/0124486 A1 | 7/2004 | Yamamoto | | |
| 2004/0150740 A1 * | 8/2004 | Hsin | ............................ | 348/340 |
| 2006/0022290 A1 * | 2/2006 | Chen et al. | ...................... | 257/432 |
| 2006/0231750 A1 * | 10/2006 | Chao et al. | ...................... | 250/239 |
| 2008/0290489 A1 * | 11/2008 | Cheng et al. | ................... | 257/680 |
| 2010/0182498 A1 * | 7/2010 | Niwa et al. | ...................... | 348/374 |

FOREIGN PATENT DOCUMENTS

| | | |
|---|---|---|
| CN | 1226341 A | 8/1999 |
| CN | 1461057 A | 12/2003 |
| KR | 102005011676 A | 12/2005 |
| KR | 1020060072579 A | 6/2006 |

* cited by examiner

*Primary Examiner* — Nicholas Giles
(74) *Attorney, Agent, or Firm* — Muir Patent Consulting, PLLC

(57) ABSTRACT

An image sensor module includes a circuit board, an image sensor package and an optical system. The circuit board has an upper surface and a lower surface, the substrate having a window. The image sensor package includes a mounting substrate and an image sensor chip mounted on the mounting substrate, the image sensor package being adhered to the lower surface of the circuit board such that the image sensor chip is exposed through the window. The optical system is provided on the upper surface of the circuit board to guide light from an object to the image sensor chip.

17 Claims, 3 Drawing Sheets

IMAGE SENSOR MODULE HAVING IMAGE SENSOR PACKAGE

PRIORITY STATEMENT

This application claims priority under 35 U.S.C. §119 to Korean Patent Application No. 10-2010-0039836, filed on Apr. 29, 2010 in the Korean Intellectual Property Office (KIPO), the entire contents of which are herein incorporated by reference.

BACKGROUND

1. Field

Example embodiments relate to an image sensor module having an image sensor package. More particularly, example embodiments relate to an image sensor module having an image sensor package mounted on a circuit board.

2. Description of the Related Art

Recently, high resolution image sensor modules have been widely used in digital devices such as digital cameras, camera phones, etc. The image sensor modules may include an image sensor for converting image information into electrical information. In particular, an image sensor may include semiconductor devices capable of converting photons to electrons to display and store images. Examples of the image sensors include charge coupled device (CCD), complementary metal oxide silicon (CMOS) image sensor (CIS), etc.

A conventional image sensor module may include a module substrate and an image sensor package provided on the module substrate. For example, the image sensor package may be ceramic leadless chip carrier (CLCC).

However, because the image sensor package is adhered on the module substrate, the total thickness of the image sensor module may be increased. Accordingly, it would be desirable to have an image sensor module with a very small thickness. It would also be beneficial for an image sensor, especially a thin one, to include excellent heat dissipation performance.

SUMMARY

Example embodiments provide an image sensor module having a reduced total thickness and an excellent heat dissipation performance.

According to example embodiments, an image sensor module includes a circuit board, an image sensor package and an optical system. The circuit board has an upper surface and a lower surface, and the substrate has a window. The image sensor package includes a mounting substrate and an image sensor chip mounted on the mounting substrate, the image sensor package being adhered to the lower surface of the circuit board such that the image sensor chip is exposed through the window. The optical system is provided on the upper surface of the circuit board to guide light from an object to the image sensor chip.

In example embodiments, the image sensor package may include a transparent member provided over the mounting substrate to cover the image sensor chip and a holder for supporting the transparent member.

In example embodiments, the transparent member may be disposed over the image sensor chip within the window region of the circuit board.

In example embodiments, the holder may extend upwardly from the mounting substrate.

In example embodiments, the holder may be disposed within the window region of the circuit board.

In example embodiments, the transparent member may have a shape corresponding to the image sensor chip.

In example embodiments, the mounting substrate of the image sensor package may include a heat-dissipating substrate and a circuit substrate provided on the heat-dissipating substrate.

In example embodiments, the heat-dissipating substrate may include a thermal conductive metal.

In example embodiments, the image sensor chip includes an image sensor portion and a boundary portion surrounding the image sensor portion, the boundary portion including at least one bonding pad.

In example embodiments, the image sensor chip may be adhered to an upper surface of the mounting substrate by an adhesive layer.

In example embodiments, the image sensor chip may be electrically connected to the mounting substrate by a plurality of conductive wires.

In example embodiments, the image sensor module may further include a plurality of conductive connection members respectively provided on a plurality of connection pads on an upper surface of the mounting substrate. The image sensor package may be electrically connected to the circuit board by the conductive connection members.

In example embodiments, the conductive connection members may include a conductive paste or a conductive ball.

In example embodiments, the connection pads may be arranged in a peripheral region of the mounting substrate.

In example embodiments, an upper surface of the image sensor chip may be positioned lower than the upper surface of the circuit board.

In example embodiments, the image sensor module may further include a heat-dissipating plate that is adhered to the lower surface of the circuit board to cover the image sensor package.

In example embodiments, the image sensor module may further include a housing adhered to the upper surface of the circuit board to support the optical system.

According to example embodiments, an image sensor module may include an image sensor package adhered to a lower surface of a circuit board and an optical system provided on an upper surface of the circuit board. An image sensor chip of the image sensor package may be exposed through a window of the circuit board and an upper surface of the image sensor chip may lower than the upper surface of the circuit board.

According to other exemplary embodiments, a device includes a circuit board and an image sensor package. The circuit board includes an upper surface, a lower surface, and a window. The image sensor package includes an image sensor chip covering a first portion of a mounting substrate, wherein an upper surface of the image sensor chip is exposed through the window. A second portion of the mounting substrate is located outside of the first portion, and is electrically and physically connected to the circuit board at an upper surface of the mounting substrate. The upper surface of the image sensor chip is located at a different height than the upper surface of the circuit board.

In another embodiment, the device may further include a holder, and a transparent member supported by the holder, wherein both the holder and the transparent member are located within an area of the window.

The mounting substrate may include a circuit substrate, and may further include a heat dissipating element contacting a lower surface of the circuit substrate.

In another embodiment, an image sensor module includes a circuit board including a window, and an image sensor mounting substrate. The image sensor mounting substrate includes a first surface adhered to a lower surface of the circuit board. The image sensor mounting substrate further includes an image sensor chip mounted on the first surface of the image sensor mounting substrate. The image sensor module further includes an optical system provided on an upper surface of the circuit board opposite the lower surface. The image sensor chip is exposed through the window of the circuit board, and an upper surface of the image sensor chip is located at a lower height than the upper surface of the circuit board.

In one embodiment, the image sensor module may further include a heat dissipating element contacting a second surface of the image sensor mounting substrate opposite the first surface of the image sensor mounting substrate.

Accordingly, a height of the optical system may be decreased. Thus, the total height of the image sensor module may be decreased to thereby provide a very thin digital camera.

Further, the image sensor module may include a heat-dissipating substrate for mounting the image sensor chip and/or a heat-dissipating plate for covering the image sensor chip. Accordingly, heat from the image sensor chip may be efficiently dissipated, thereby enhancing the heat dissipating performance of the image sensor module.

BRIEF DESCRIPTION OF THE DRAWINGS

Example embodiments will be more clearly understood from the following detailed description taken in conjunction with the accompanying drawings.

FIG. 1 is a cross-sectional view illustrating an image sensor module having an image sensor package in accordance with an example embodiment.

FIG. 2 is a perspective view illustrating the image sensor package of FIG. 1.

FIG. 3 is an exploded perspective view illustrating the image sensor package of FIG. 2.

FIG. 4 is a cross-sectional view illustrating an image sensor module in accordance with another example embodiment.

DETAILED DESCRIPTION OF EXAMPLE EMBODIMENTS

Figure 1:
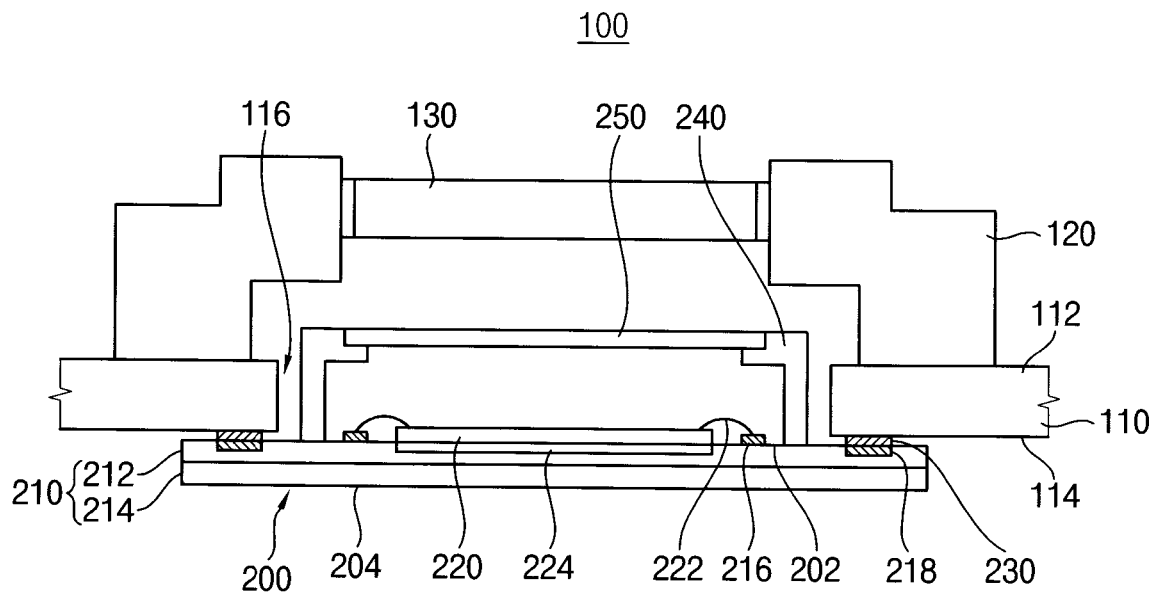
FIGS. 1 to 4 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
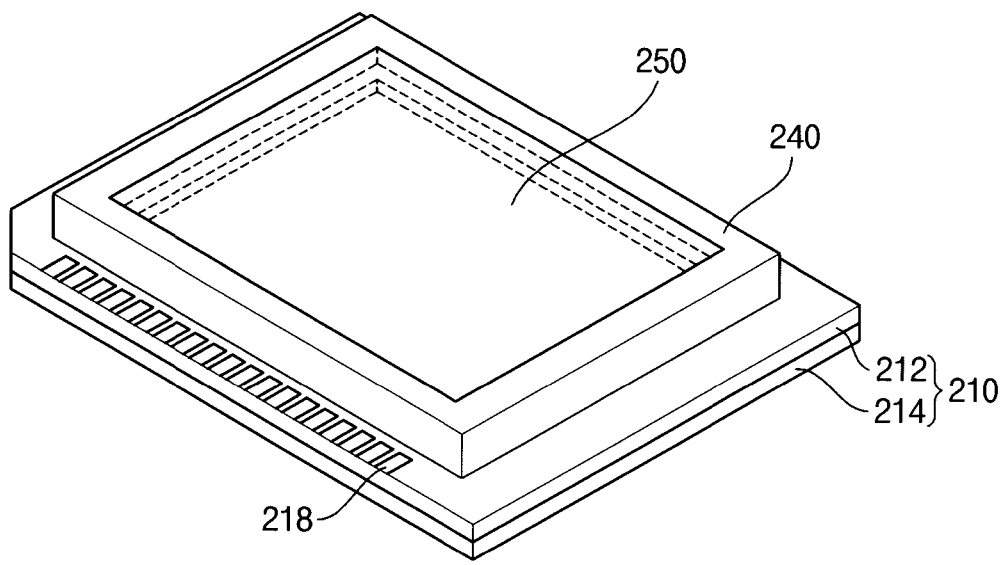
Figure 3:
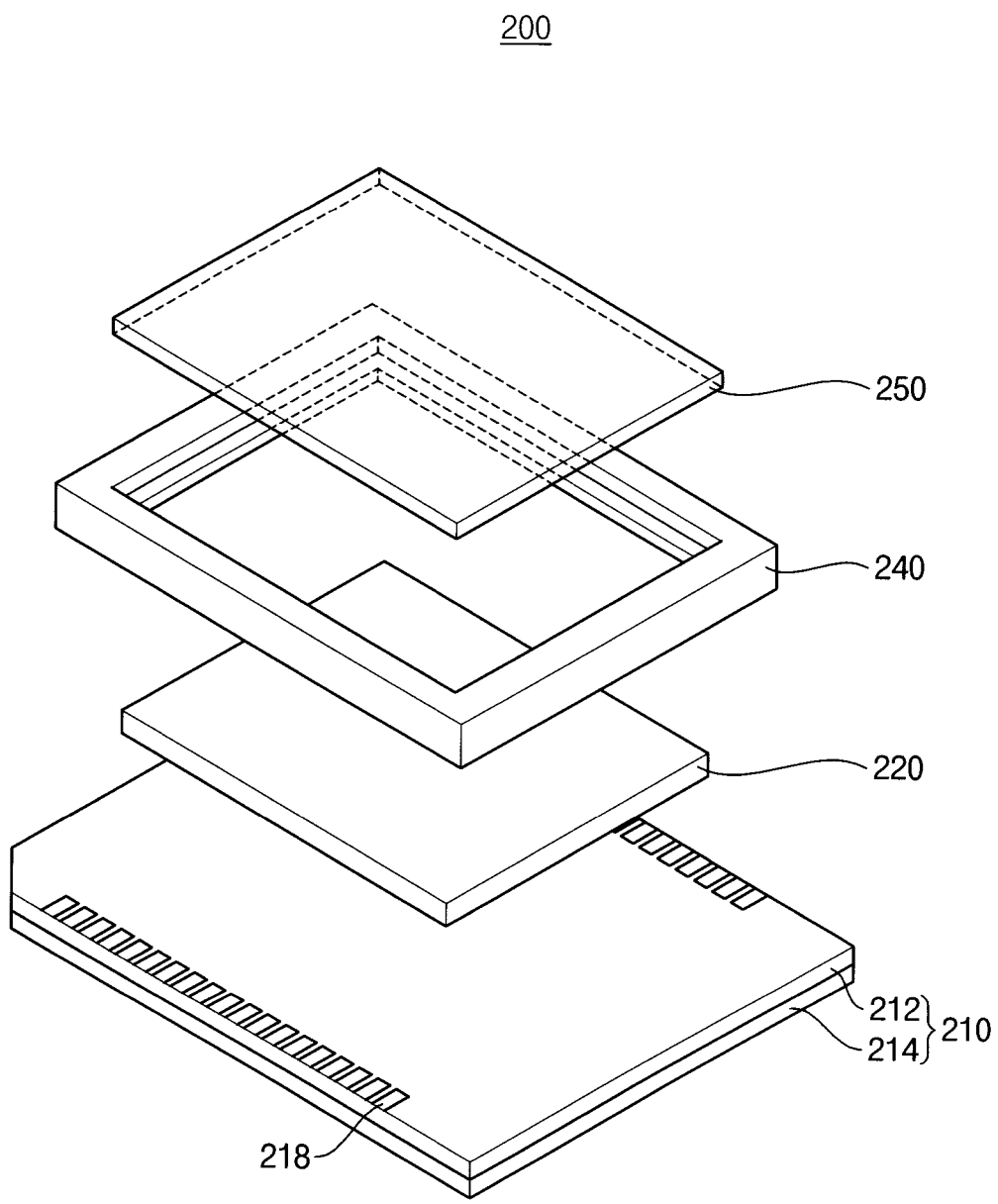

FIG. 1 is a cross-sectional view illustrating an image sensor module having an image sensor package in accordance with an example embodiment. FIG. 2 is a perspective view illustrating the image sensor package of FIG. 1. FIG. 3 is an exploded perspective view illustrating the image sensor package of FIG. 2.

Referring to FIGS. 1 to 3, an image sensor module 100 according to an example embodiment includes a circuit board 110, an image sensor package 200 adhered to the circuit board 110 and an optical system 130 provided on the circuit board 110.

In an example embodiment, the circuit board 110 may have an upper surface 112 and a lower surface 114. The circuit board 110 may have a window 116 that penetrates the circuit board 110. That is, the window may be formed through part of the circuit board such that the area covered by the circuit board includes a board portion surrounding a window portion. The circuit board 110 may have a circuit pattern (not illustrated) for electrical connection to an external device. In one embodiment, the image sensor package 200 may be adhered to the lower surface 114 of the circuit board 110. The optical system 130 may be provided on the upper surface 112 of the circuit board 110.

The image sensor package 200 may include a mounting substrate 210 and an image sensor chip 220 mounted on the mounting substrate 210. The image sensor chip 220 may be mounted on an upper surface 202 of the mounting substrate 210. For example, the image sensor chip 220 may include CMOS (Complementary Metal Oxide Silicon) image sensor. The image sensor chip 220 may include an image sensor portion and a surrounding portion that includes one or more bonding pads.

A CMOS image sensor (CIS), for example, may include an active pixel region for image pickup and a CMOS logic region for controlling output signals from the active pixel region. The active pixel region may include photodiodes and MOS transistors. The CMOS logic region may include a plurality of CMOS transistors.

The mounting substrate 210 may include an image sensor region and a peripheral region. The image sensor chip may be disposed in the image sensor region of the mounting substrate 210. A plurality of bonding pads 216 for electrical connection to the image sensor chip 220 may be arranged in the peripheral region of the mounting substrate 210. A plurality of connection pads 218 for electrical connection to the circuit board 110 may also be arranged in the peripheral region of the mounting substrate 210.

The mounting substrate 210 may include a heat-dissipating substrate 214 (also referred to as a heat-dissipating element) and a circuit substrate 212 on the heat-dissipating substrate 214. The heat-dissipating substrate 214 may be a core substrate including a conductive metal, and not including any circuitry or other connection elements for electrically connecting to circuitry. As such, the heat-dissipating element 214 may serve as a heat sink for transferring heat from the circuit substrate 212 to outside of the image sensor module 100. Examples of the conductive metal may be aluminum, copper, etc. The circuit substrate 212 may be adhered to the heat-dissipating substrate 214 by an adhesive film (not illustrated). The circuit substrate 212 may include a circuit pattern for electrically connecting the image sensor chip 220 and the circuit board 110.

The image sensor chip 220 may be adhered to the upper surface 202 of the mounting substrate 210 by an adhesive layer 224. A plurality of bonding pads (not illustrated) may be formed on an active surface of the image sensor chip 220, for example in a boundary region surrounding an image sensor region. The bonding pads of the image sensor chip 220 may be electrically connected to the bonding pads 216 of the mounting substrate 210 by a plurality of conductive wires 222. Accordingly, the image sensor chip 220 may be electrically connected to the mounting substrate 210 by the conductive wires 222. Alternatively, the image sensor chip 220 may be electrically connected to the mounting substrate 220 by other connection members such as a through-via, a solder ball, etc.

In an example embodiment, the image sensor package 200 may further include a transparent member 250 over the image sensor chip 220 and a holder 240 for supporting the transparent member 250.

A lower portion of the holder 240 may be arranged in the peripheral region of the mounting substrate 210 to surround the image sensor chip 220. The holder 240 may have a shape corresponding to the image sensor chip 220 (e.g., a rectangular shape). Accordingly, the image sensor chip 220 may be arranged within the holder 240. The lower portion of the holder 240 may be arranged between the bonding pads 216 and the connection pads 218. Accordingly, the connection pads 218 may be arranged outside the holder 240.

The holder 240 may extend upwardly from the mounting substrate 210. The transparent member 250 may be supported by an upper portion of the holder 240. Accordingly, the transparent member 250 may be disposed over the image sensor chip 220 to cover the image sensor chip 220.

The transparent member 250 may have a shape corresponding to the image sensor chip 220 (e.g., a rectangular shape). The distance between the transparent member 250 and the image sensor chip 220 may be determined based on the height of the holder 240. The transparent member 250 may serve as an optical filter. For example, the transparent member 250 may include a transparent material such as glass.

In an example embodiment, the image sensor package 200 may be adhered to the lower surface 114 of the circuit board 110 such that the image sensor chip 220 is exposed through the window 116. The transparent member 250 of the image sensor package 200 may also be arranged within the window 116 of the circuit board 110. Accordingly, both the holder 240 holding the transparent member 250 and the image sensor chip 220 may extend from the top surface of the image sensor package 200 and may be positioned entirely within the window 116 in the circuit board 110, and the upper surface of the image sensor chip 220 may be lower than the upper surface of the circuit board 110. That is, in one embodiment, if the mounting substrate 210 is considered the bottom of the image sensor module 100, and the optical system 130 is considered the top of the image sensor module 100, then the upper surface of the image sensor chip 220 may be located at a lower height than the upper surface of the circuit board 110 (e.g., the distance between the upper surface of the image sensor chip 220 and the bottom of the mounting substrate 210 may be less than the distance between the upper surface of circuit board 110 and the bottom of the mounting substrate 210).

The image sensor package 200 may be mounted on the circuit board 110 by a surface mount technology (SMT). The image sensor package 200 may be connected to the circuit board 110 via a plurality of conductive connection members 230. The connection member 230 may be disposed on the connection pad 218 on the upper surface 202 of the mounting substrate 210. Accordingly, the connection member 230 may electrically connect the connection pad 218 of the mounting substrate 210 to the circuit pattern on the lower surface 114 of the circuit board 110.

For example, the connection member 230 may include a conductive paste. Accordingly, the image sensor package 200 may be adhered to the lower surface 114 of the circuit board 110 by the conductive paste. Alternatively, the image sensor package 200 may be connected to the circuit board 110 by another conductive material such as bump.

In an example embodiment, the optical system 130 may be arranged over the image sensor package 200 to guide light from an object to the image sensor chip 220. In particular, a housing 120 may be adhered to the upper surface 112 of the circuit board 110 to support the optical system 130. The optical system 130 may include, for example, one or more lenses and a lens barrel for adjusting the lenses. Accordingly, the optical system 130 includes one or more elements that direct and focus light from the object on the image sensor chip 220.

The image sensor module in accordance with an example embodiment may include the image sensor package 200 adhered to the lower surface 114 of the circuit board 110 and the optical system on the upper surface 112 of the circuit board 110. The image sensor chip 220 of the image sensor package 200 may be exposed through the window 116 of the circuit board 110. Accordingly, light from the optical system 130 may propagate through the window 116 of the circuit board 110 to the active surface of image sensor chip 220.

Because the image sensor package 200 is adhered to the lower surface 114 of the circuit board 110, the upper surface of the image sensor chip 220 may be lower than the upper surface 112 of the circuit board 110. Accordingly, a required distance between the optical system 130 and the image sensor chip 220, that is, a required back focal length may be guaranteed and the height of the optical system 130 from the circuit board 110 may be decreased. Thus, the total height of the image sensor module 100 may be decreased to thereby provide a very thin digital camera.

Further, the mounting substrate 210 of the image sensor package 200 may include the heat-dissipating substrate 214. Accordingly, the heat-dissipating substrate 214 may efficiently dissipate heat from the image sensor chip 220, thereby enhancing the heat dissipating performance of the image sensor package 200.

Figure 4:
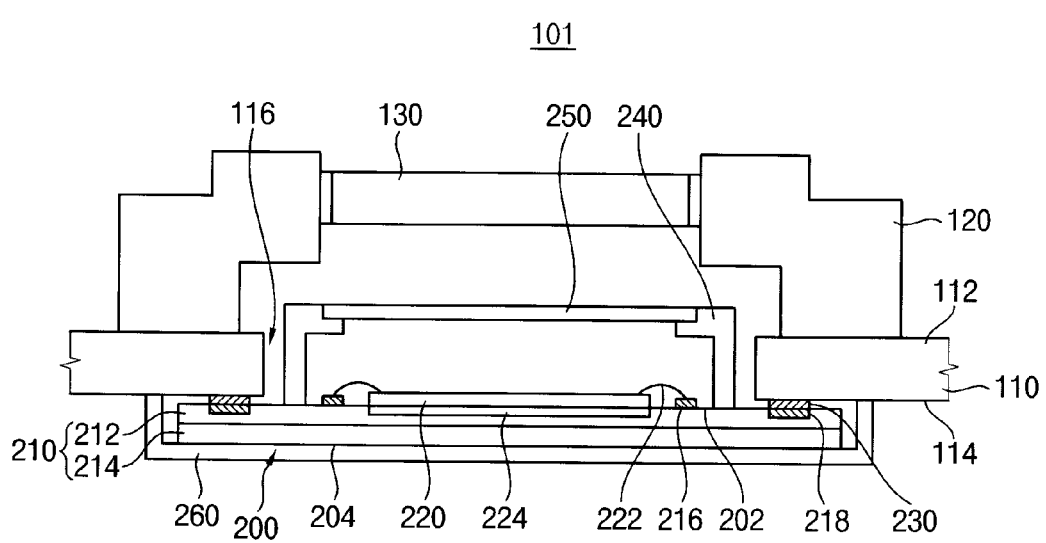

FIG. 4 is a cross-sectional view illustrating an image sensor module in accordance with another example embodiment. The image sensor module of the present embodiment is substantially the same as in the embodiment of FIG. 1 except an additional heat-dissipating plate. Thus, the same reference numerals will be used to refer to the same or like elements as those described in the embodiment of FIG. 1 and any further repetitive explanation concerning the above elements will be omitted.

Referring to FIG. 4, an image sensor module 101 according to another example embodiment includes a circuit board 110, an image sensor package 200 adhered to a lower surface 114 of the circuit board 110, an optical system 130 provided on the circuit board 110 and a heat-dissipating plate 260 provided on the lower surface 114 of the circuit board 110 and the lower surface of 204 of the image sensor package.

The image sensor package 200 may include a mounting substrate 210 and an image sensor chip 220 mounted on the mounting substrate 210. The image sensor chip 220 may be mounted on an upper surface 202 of the mounting substrate 210. The image sensor package 200 may further include a transparent member 250 over the image sensor chip 220 and a holder 240 for supporting the transparent member 250.

The mounting substrate 210 may include a heat-dissipating substrate 214 and a circuit substrate 212 on the heat-dissipating substrate 214, or may only include the circuit substrate 212. The heat-dissipating substrate 214 may be a core substrate including a conductive metal. Examples of the conductive metal may be aluminum, copper, etc. The circuit substrate 212 may be adhered to the heat-dissipating substrate 214 by an adhesive film (not illustrated). The circuit substrate 212 may include a circuit pattern for electrically connecting the image sensor chip 220 and the circuit board 110.

The image sensor package 200 may be adhered to the lower surface 114 of the circuit board 110 such that the image sensor chip 220 is exposed through a window 116. The transparent member 250 of the image sensor package 200 may be arranged within the window 116 of the circuit board 110. Accordingly, the upper surface of the image sensor chip 220 may be lower than the upper surface of the circuit board 110.

The image sensor package 200 may be mounted on the circuit board 110 by a surface mount technology (SMT). The image sensor package 200 may be connected to the circuit board 110 via a plurality of conductive connection members 230. The connection member 230 may be disposed on the connection pad 218 on the upper surface 202 of the mounting substrate 210. Accordingly, the connection member 230 may electrically connect the connection pad 218 of the mounting substrate 210 to the circuit pattern on the lower surface 114 of the circuit board 110.

For example, the connection member 230 may include a conductive paste. Accordingly, the image sensor package 200 may be adhered to the lower surface 114 of the circuit board 110 by the conductive paste. Alternatively, the image sensor package 200 may be connected to the circuit board 110 by another conductive material such as bump.

The optical system 130 may be arranged over the image sensor package 200 to guide light from an object to the image sensor chip 220. In particular, a housing 120 may be adhered to the upper surface 112 of the circuit board 110 to support the optical system 130. Accordingly, the optical system 130 may focus light from the object on the image sensor chip 220.

In another example embodiment, the heat-dissipating plate 260 may be adhered to the lower surface 114 of the circuit board 110 to cover the image sensor package 200, and/or may be adhered to the lower surface 204 of the image sensor package. The heat-dissipating plate 260 may be arranged adjacent to the dissipating substrate 214 of the mounting substrate 210. The heat-dissipating plate 260 may serve as a heat sink for the image sensor package 200. As such, in one embodiment, the heat-dissipating plate 260 contacts both a lower surface 114 of the circuit board 110 and a lower surface 204 of the mounting substrate 210, such that it conducts heat away from both the circuit board 110 and the mounting substrate 210. In another embodiment, though not shown, heat-dissipating plate 260 could replace the dissipating substrate 214, to make the image sensor module 101 thinner while still including a heat dissipating element in contact with both the circuit board 110 and the mounting substrate 210.

The heat-dissipating plate 260 may include a material having an high thermal conductivity. Examples of the material may be aluminum, copper, etc. As described above, the heat-dissipating plate 260 may make contact with the lower surface 204 of the image sensor package 200 to dissipate heat from the image sensor package 200.

As mentioned above, an image sensor module in accordance with example embodiments may include an image sensor package adhered to a lower surface of a circuit board and an optical system provided on an upper surface of the circuit board. An image sensor chip of the image sensor package may be exposed through a window of the circuit board and an upper surface of the image sensor chip may lower than the upper surface of the circuit board.

Accordingly, a required height of the optical system may be decreased. Thus, the total height of the image sensor module may be decreased to thereby provide a very thin digital camera.

Further, the image sensor module may include a heat-dissipating substrate for mounting the image sensor chip and/or a heat-dissipating plate for covering the image sensor chip. Accordingly, heat from the image sensor chip 220 may be efficiently dissipated, thereby enhancing the heat dissipating performance of the image sensor module.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An image sensor module, comprising:
a circuit board having an upper surface and a lower surface, the circuit board having a window;
an image sensor package including a mounting substrate and an image sensor chip mounted on the mounting substrate, the image sensor package being adhered to the lower surface of the circuit board such that the image sensor chip is exposed through the window;
an optical system provided on the upper surface of the circuit board configured to guide light from an object to the image sensor chip;
a plurality of conductive connection members respectively provided on a plurality of connection pads on an upper surface of the mounting substrate, wherein the image sensor package is electrically connected to the circuit board by the conductive connection members;
a plurality of bonding pads electrically connecting the mounting substrate to the image sensor chip;
a transparent member provided over the mounting substrate to cover the image sensor chip;
a holder for supporting the transparent member,
wherein the holder extends upwardly from the mounting substrate, the image sensor chip and plurality of bonding pads are arranged within the holder, and the plurality of conductive connection members are arranged outside of the holder,
wherein the mounting substrate of the image sensor package includes a heat-dissipating substrate attached to a lower surface of a circuit substrate, and
wherein the heat-dissipating substrate comprises a thermal conductive metal; and
a heat-dissipating plate contacting a lower surface of the thermal conductive metal, and extending to contact the lower surface of the circuit board.

2. The image sensor module of claim 1, wherein the transparent member is disposed over the image sensor chip within the window region of the circuit board.

3. The image sensor module of claim 1, wherein the holder is disposed within the window region of the circuit board.

4. The image sensor module of claim 1, wherein the transparent member has a shape corresponding to the image sensor chip.

5. The image sensor module of claim 1, wherein the heat-dissipating substrate is attached to the circuit substrate using an adhesive film.

6. The image sensor module of claim 5, wherein the heat-dissipating substrate does not include circuitry.

7. The image sensor module of claim 1, wherein the image sensor chip includes an image sensor portion and a boundary portion surrounding the image sensor portion, the boundary portion including the plurality of bonding pads.

8. The image sensor module of claim 1, wherein each of the conductive connection members comprises a conductive paste or a conductive ball.

9. The image sensor module of claim 1, wherein the connection pads are arranged in a peripheral region of the mounting substrate.

10. The image sensor module of claim 1, wherein an upper surface of the image sensor chip is positioned lower than the upper surface of the circuit board.

11. The image sensor module of claim 1, wherein the heat-dissipating plate surrounds outer sides of the heat-dissipating substrate and the circuit substrate.

12. The image sensor module of claim 1, further comprising a housing adhered to the upper surface of the circuit board to support the optical system.

13. A device comprising:
a circuit board including an upper surface, a lower surface, and a window;
an image sensor package including a mounting substrate and an image sensor chip covering a first portion of the mounting substrate, wherein an upper surface of the image sensor chip is exposed through the window;
a transparent member provided over the mounting substrate to cover the image sensor chip; and
a holder for supporting the transparent member, the holder located within the window,
wherein a second portion of the mounting substrate is located outside of the first portion, the second portion electrically and physically connected to the circuit board at an upper surface of the mounting substrate,
wherein the upper surface of the image sensor chip is located at a different height than the upper surface of the circuit board, and
wherein an upper surface of the transparent member is located above the upper surface of the circuit board, and a lower surface of the transparent member is located between an upper-most surface of the holder and a lower-most surface of the holder.

14. The device of claim 13, wherein both the holder and the transparent member are located within an area of the window.

15. The device of claim 13, wherein the mounting substrate includes a circuit substrate, and further comprising:
a heat dissipating element contacting a lower surface of the circuit substrate.

16. An image sensor module, comprising:
a circuit board including a window;
an image sensor mounting substrate including a first surface adhered to a lower surface of the circuit board, wherein an image sensor chip is mounted on the first surface of the image sensor mounting substrate;
an optical system provided on an upper surface of the circuit board opposite the lower surface,
wherein the image sensor chip is exposed through the window of the circuit board, and an upper surface of the image sensor chip is located at a lower height than the upper surface of the circuit board; and wherein the image sensor mounting substrate includes a circuit substrate and a heat dissipating substrate adhered to a lower surface of the circuit substrate; and a heat-dissipating plate contacting a lower surface of the heat-dissipating substrate and contacting the circuit board.

17. The image sensor module of claim 16, further comprising:

an adhesive film adhering the heat-dissipating substrate to the lower surface of the circuit substrate.

* * * * *